United States Patent
Haase

(10) Patent No.: US 7,525,151 B2
(45) Date of Patent: Apr. 28, 2009

(54) VERTICAL DMOS DEVICE IN INTEGRATED CIRCUIT

(75) Inventor: Robert P Haase, Newport (GB)

(73) Assignee: International Rectifier Corporation, El Segundo, CA (US)

( * ) Notice: Subject to any disclaimer, the term of this patent is extended or adjusted under 35 U.S.C. 154(b) by 472 days.

(21) Appl. No.: 11/326,009

(22) Filed: Jan. 5, 2006

(65) Prior Publication Data

US 2007/0152269 A1 Jul. 5, 2007

(51) Int. Cl.
*H01L 23/62* (2006.01)
(52) U.S. Cl. .................. 257/335; 257/548
(58) Field of Classification Search ........... 257/335, 257/548
See application file for complete search history.

(56) References Cited

U.S. PATENT DOCUMENTS

| 5,317,180 | A | 5/1994 | Hutter et al. |
| 5,356,822 | A | 10/1994 | Lin et al. |
| 6,538,289 | B1 | 3/2003 | Topp et al. |
| 6,703,684 | B2 * | 3/2004 | Udrea et al. ............ 257/548 |
| 6,861,341 | B2 | 3/2005 | Chen et al. |

OTHER PUBLICATIONS

International Search Report issued in corresponding PCT Application No. PCT/US06/49514 on Apr. 24, 2008.

* cited by examiner

*Primary Examiner*—Douglas M Menz
(74) *Attorney, Agent, or Firm*—Ostrolenk, Faber, Gerb & Soffen, LLP

(57) ABSTRACT

An integrated circuit that includes at least one vertical conduction DMOS device and other semiconductor devices.

8 Claims, 3 Drawing Sheets

VERTICAL DMOS DEVICE IN INTEGRATED CIRCUIT

BACKGROUND OF THE INVENTION

1. Field of the Invention

The present invention relates to semiconductor devices, and more particularly, to an integrated circuit (IC) device that includes DMOS and other semiconductor devices in a common wafer and to methods of fabricating the same.

2. Description of the Related Art and Summary of the Invention

MOSgated devices remain prevalently used semiconductor devices. As used herein, generally, a MOSgated device refers to a MOSFET, IGBT or the like. Devices comprising integrated circuits typically use MOSgated devices, for example, for power switching and transfer. It is desirable to have an IC which includes DMOS devices along with other devices.

An integrated circuit according to the present invention includes a semiconductor wafer. The wafer includes a plurality of electrically isolated semiconductor devices.

According to one aspect of the present invention, at least one of the devices is a vertical conduction DMOS that includes a gate, one power electrode on one side thereof, and another power electrode on an opposing side thereof. In the preferred embodiment, the DMOS is a MOSFET. According to an aspect of the present invention the DMOS is disposed in an insulation tub, which is formed by trenched insulation walls that intersect a buried insulation layer. In the preferred embodiment, each of the semiconductor devices is disposed in a respective insulation tub.

According to another aspect of the present invention, the wafer includes a first wafer that is bonded to a second wafer. Preferably, the two wafers are bonded through an insulation layer, such as a silicon dioxide layer, which then serves as the buried insulation layer. An example of such a wafer is conventionally referred to as a silicon on insulator (SOI) wafer. It should be noted techniques other than bonding may be used to obtain an SOI wafer without deviating from the scope and spirit of the present invention.

In a method according to the present invention, a plurality of trenches are formed in the first semiconductor wafer of an SOI wafer, each trench reaching at least the buried insulation body. Thereafter, the trenches are filled with an insulation body to form insulation walls, whereby insulation walls and the buried insulation body form insulation tubs each around a semiconductor body.

According to one aspect of the present invention, each of the plurality of semiconductor devices is formed in the first wafer prior to forming the trenches, whereby the trenches are used to isolate the semiconductor devices from one another prior to filling the trenches with an insulation body.

According to another aspect of the present invention, a vertical conduction DMOS is formed in at least one of the semiconductor bodies, a portion of the second wafer (which may be made from silicon) and a portion of the buried insulation body are removed from under the DMOS, and a second power electrode is formed to make contact with the back of the DMOS to obtain a vertical conduction DMOS in the single wafer.

BRIEF DESCRIPTION OF THE DRAWINGS

For the purposes of illustrating the invention, there is shown in the drawings a form which is presently preferred, it being understood, however, that the invention is not limited to the precise arrangements and instrumentalities shown.

DETAILED DESCRIPTION OF THE DRAWINGS

Figure 1:
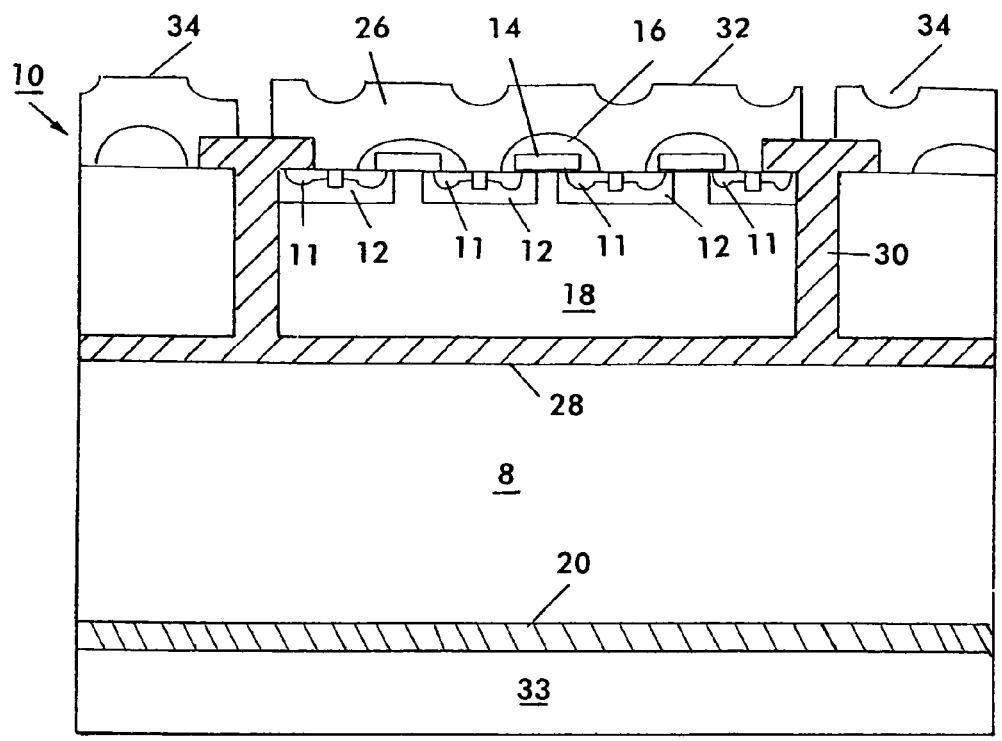
FIG. 1 is a cross-sectional view of an IC that includes a DMOS device and other semiconductor devices prior to fabrication of a device according to the present invention.

Referring to the drawing figures in which like references refer to like elements, FIG. 1 shows a cross-sectional view of a portion of an IC 10 which is further processed to obtain an IC according to the present invention. IC 10 includes a plurality of semiconductor devices, at least one of which is a double diffused MOS device ("DMOS") 32 of the vertical conduction variety. IC 10 according to the preferred embodiment of the present invention may also include one or more complementary MOS ("CMOS") 34 devices.

IC 10 includes semiconductor wafer 8 made, for example, of silicon that includes buried oxide layer 28, which is preferably formed with $SiO_2$. According to one aspect of the present invention, wafer 8 is fabricated by bonding two wafers to one another. Specifically, an oxide body (e.g. $SiO_2$) is used to bond two wafers. The oxide body then serves as buried oxide layer 28 in wafer 8. Thereafter, the semiconductor devices are formed in wafer 8.

As is well known, DMOS 32 includes drift region (or drain region 18) of one conductivity, channel regions (or sometimes referred to as base or body regions) 12 of opposite conductivity formed in drift region 18, source regions 11 of the same conductivity as drift region 18 formed in channel regions 12 and isolated from drift region 18 by an invertible channel, gate structures 16 formed over at least invertible channels, and a source electrode 26 ohmically connected to source regions 11 and channel regions 12.

DMOS 32 is electrically insulated from any adjacent device by trenched isolation walls 30 and a portion of buried oxide layer 28. Specifically, buried oxide layer 28 intersects with trenched isolation walls 30 which together form an insulation tub to insulate DMOS 32 from adjacent devices. Insulation walls 30 may be fabricated by forming trenches that reach buried oxide layer 28 and filling the same with an oxide (e.g. $SiO_2$) or the like to form one or more insulation tubs. Thereafter, a plurality of semiconductor devices (including features for a vertical conduction DMOS) can be formed in the semiconductor body in each insulation tub. Alternatively, the semiconductor devices can be formed and then insulation walls 30 can be fabricated to form insulation tubs around each semiconductor device.

As seen in FIG. 1, drift region 18 of DMOS 32 resides over, but is insulated from the bulk silicon below buried oxide layer 28. According to an aspect of the present invention, the bulk silicon from below DMOS 32 is removed along with at least a portion of buried oxide layer 28 and a drain contact is formed to make ohmic contact with drift region 18. As a result, a vertical conduction DMOS device 32 may be realized in an IC along with other devices such as CMOS devices or the like.

Figure 2:
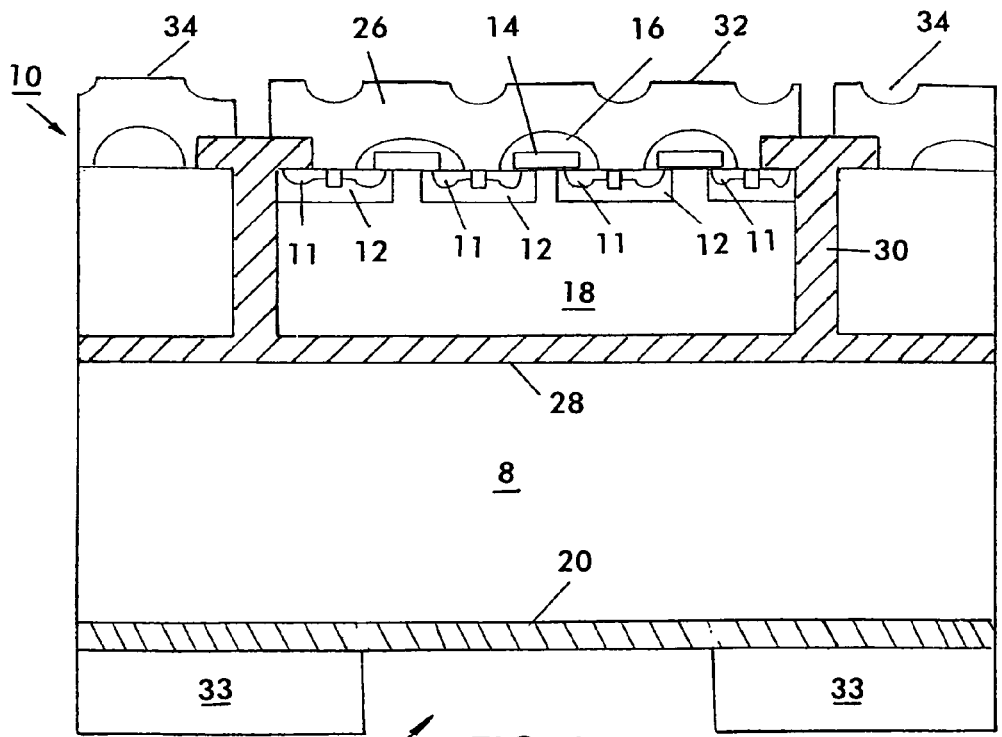
FIGS. 2-6 illustrate a method for fabricating an IC in accordance with an embodiment of the present invention

To begin fabricating an IC according to the present invention, a photo-resistive layer 33 is deposited on insulating layer 20 (which is preferably an $SiO_2$ layer) on the back of wafer 8. Referring next to FIG. 2, a portion of photoresist 33 below DMOS device 32 is removed to obtain an opening 35, which provides access to insulation layer 20. Opening 35 designates an area to etch away in order to reach drift region 18 of DMOS device 32.

Figure 3:
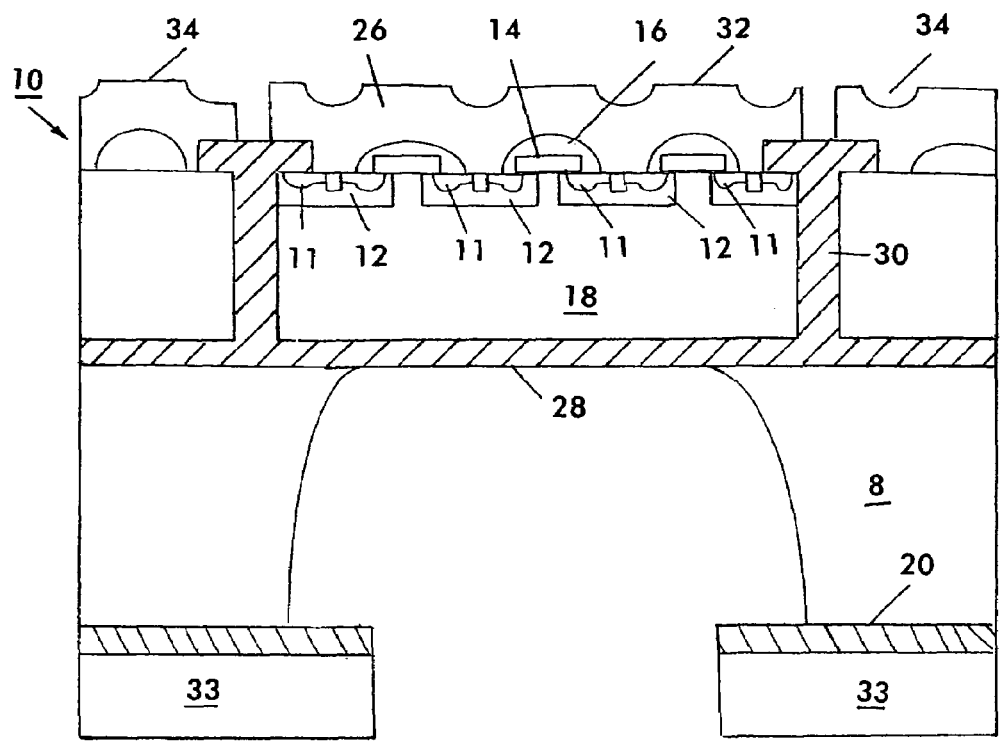

Referring next to FIG. 3, using hydrofluoric acid insulating layer 20 is removed from the regions exposed by openings in the photoresist layer 33. Thereafter, bulk silicon from beneath DMOS device 32 is removed according to any known method leaving the profile seen in FIG. 3.

Figure 4:
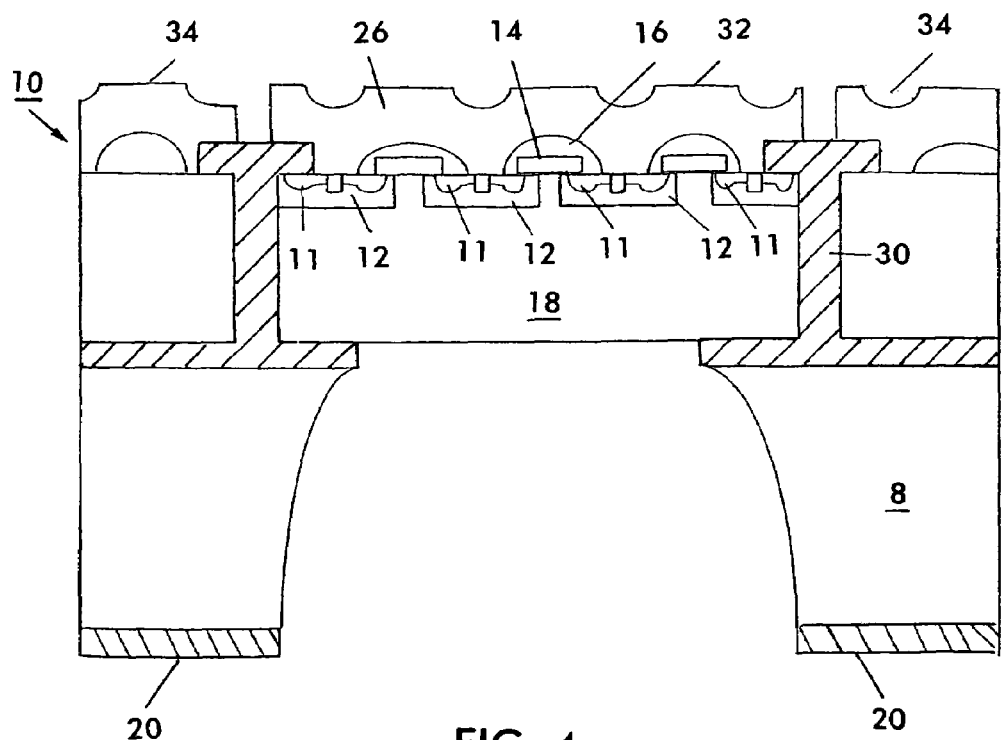

Referring to FIG. 4, hydrofluoric acid is used to remove the exposed insulating layers 20 from the back of the wafer and buried oxide layer 28 from the bottom of drift region 18. By removing buried oxide layer 28, the silicon located in drift region 18 and immediately below device 32 is exposed.

Next photoresist layer 33 is removed, leaving insulating layer 20 as shown in FIG. 4. Retaining insulating layer 20 is preferred to improve electrical isolation when multiple devices are included on one die. To further improve electrical isolation between multiple devices, the silicon below buried oxide layer 28 is selected to be of high resistivity.

Figure 5:
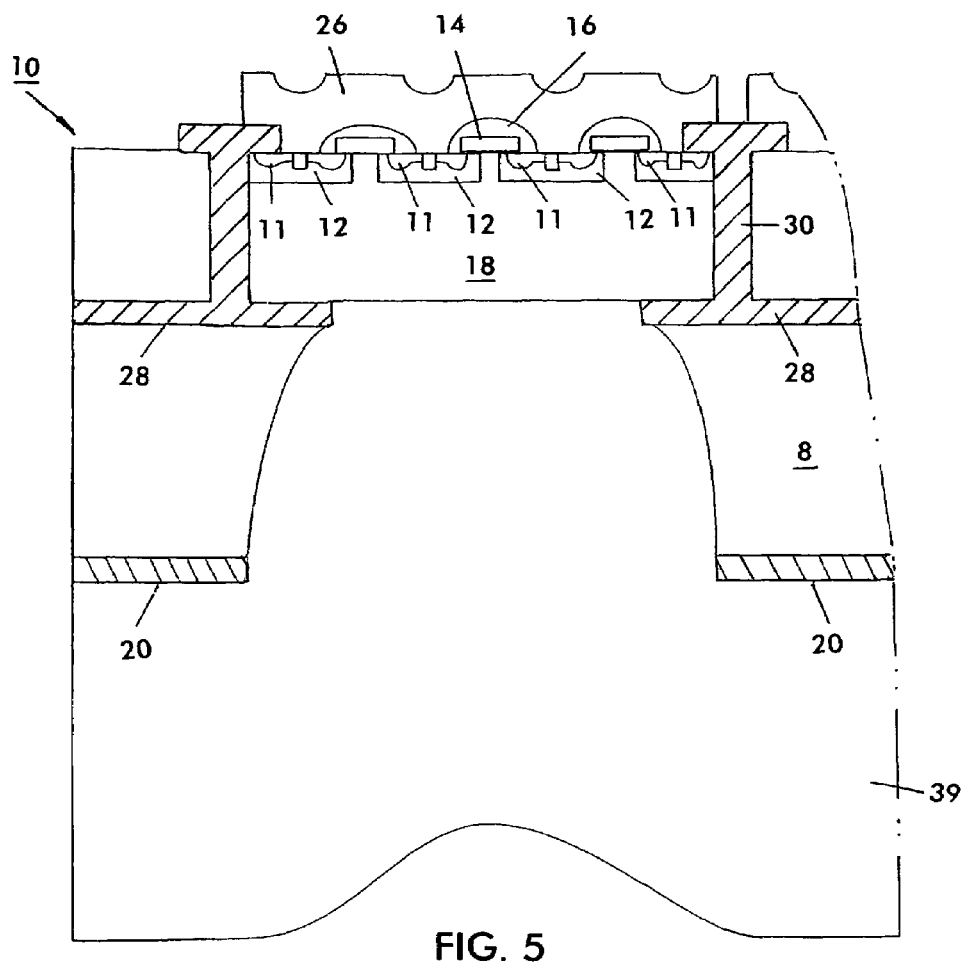

Referring next to FIG. 5, a relatively thick layer of contact metal 39, such as aluminum or copper is deposited to provide contact to the exposed silicon of drift region 18 of DMOS 32. Preferably, the contact metal 39 is deposited by sputtering.

Figure 6:
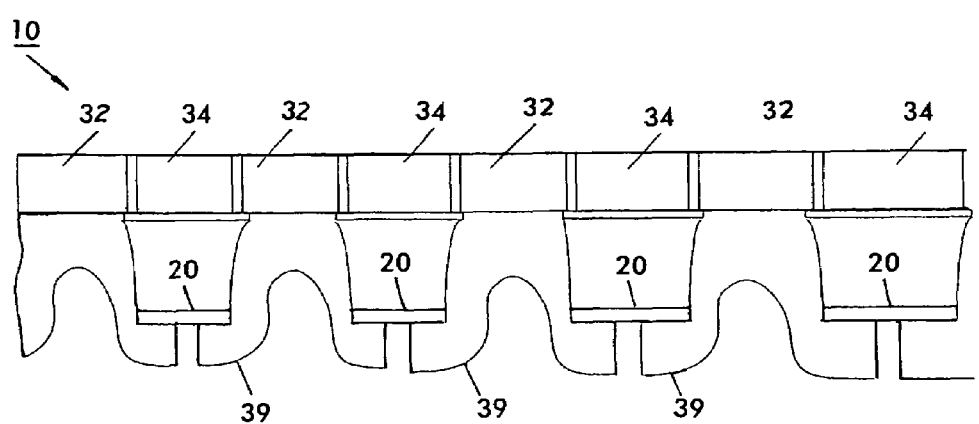

FIG. 6 illustrates an IC according to another embodiment in which a plurality of CMOS devices 34 and a plurality of DMOS devices 32 are formed in a common wafer 8 preferably adjacent one another in accordance with the teachings herein. Each DMOS device 32 shown in FIG. 6 has a separate drain connection 39. Each drain connection 39 may be fabricated by forming a single contact layer and using photolithography to obtain individual drain contacts 39.

An IC according to the present invention may include a micro electro-mechanical system (MEMS), a sensor, an actuator, or other devices.

Although the present invention has been described in relation to particular embodiments thereof, many other variations and modifications and other uses will become apparent to those skilled in the art. Therefore, that the present invention should not be limited by the specific disclosure.

What is claimed is:

1. An integrated circuit comprising:
a semiconductor wafer that includes a plurality of semiconductor devices, said plurality of semiconductor devices including a CMOS and a first vertical conduction DMOS and a second vertical conduction DMOS, each vertical conduction DMOS including a gate, one power electrode on one side thereof, and another power electrode on an opposing side thereof, a first insulation wall adjacent said CMOS and said first DMOS and a second insulation wall adjacent said CMOS and said second DMOS and an insulation layer under said CMOS and extending between said first insulation wall and said second insulation wall, wherein said CMOS is disposed between said first DMOS and said second DMOS and insulated from said first DMOS and said second DMOS by an insulation tub comprised of said first insulation wall, said second insulation wall and said insulation layer.

2. The integrated circuit of claim 1, wherein said first and second insulation walls and insulation layer are comprised of silicon dioxide.

3. The integrated circuit of claim 1, wherein said semiconductor wafer is comprised of a first wafer and a second wafer fused to said first wafer.

4. The integrated circuit of claim 3, wherein said first and said second wafers are comprised of silicon.

5. The integrated circuit of claim 3, wherein said another power electrode extends through said second wafer to reach said DMOS.

6. The integrated circuit of claim 1, wherein at least one of said plurality of semiconductor devices is a MEMS.

7. The integrated circuit of claim 1, wherein at least one of said plurality of semiconductor devices is a sensor.

8. The integrated circuit of claim 1, wherein at least one of said plurality of semiconductor devices is an actuator.

* * * * *